(12) United States Patent
Lamesch et al.

(10) Patent No.: US 11,099,223 B2
(45) Date of Patent: Aug. 24, 2021

(54) CAPACITIVE SENSOR SYSTEM

(71) Applicant: IEE INTERNATIONAL ELECTRONICS & ENGINEERING S.A., Echternach (LU)

(72) Inventors: Laurent Lamesch, Reichlange (LU); Michael Puetz, Trier (DE); Christoph Wendt, Mettendorf (DE); Gianluca Favalli, Aubange (BE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/757,413

(22) PCT Filed: Oct. 12, 2018

(86) PCT No.: PCT/EP2018/077939
§ 371 (c)(1),
(2) Date: Apr. 19, 2020

(87) PCT Pub. No.: WO2019/076769
PCT Pub. Date: Apr. 25, 2019

(65) Prior Publication Data
US 2020/0341041 A1    Oct. 29, 2020

(30) Foreign Application Priority Data
Oct. 19, 2017   (LU) ................... LU 100490

(51) Int. Cl.
*G01R 27/26* (2006.01)
*G01D 5/24* (2006.01)
*G06F 3/044* (2006.01)

(52) U.S. Cl.
CPC ........... *G01R 27/2605* (2013.01); *G01D 5/24* (2013.01); *G06F 3/044* (2013.01)

(58) Field of Classification Search
CPC .... G01R 27/2605; G01R 31/50; G01R 31/52; G01R 31/54; G01R 31/58; G01R 31/70; G01R 31/71; G01D 5/24; G06F 3/044
See application file for complete search history.

(56) References Cited

U.S. PATENT DOCUMENTS

| | | | |
|---|---|---|---|
| 2008/0018608 | A1 | 1/2008 | Serban et al. |
| 2010/0045308 | A1 | 2/2010 | Hall et al. |

(Continued)

FOREIGN PATENT DOCUMENTS

| | | |
|---|---|---|
| CN | 101490642 A | 7/2009 |
| CN | 103217185 A | 7/2013 |

(Continued)

OTHER PUBLICATIONS

International Search Report corresponding to International Application No. PCT/EP2018/077939, dated Jan. 7, 2019, 3 pages.

(Continued)

*Primary Examiner* — Patrick Assouad
*Assistant Examiner* — Demetrius R Pretlow
(74) *Attorney, Agent, or Firm* — Reising Ethington P.C.

(57) ABSTRACT

A capacitive sensor system that includes: a sensor arrangement with a plurality of capacitive electrodes, each being connected to a corresponding detector line; and a detector device connected to each detector line and configured to detect the capacitance of each electrode by applying a detector signal. The sensor arrangement includes: at least one electrode group having at least two electrodes, each electrode of an electrode group being connected to another electrode via a resistive element so that all electrodes of this electrode group are connected in series; and a diagnose device that is connected, for each electrode group, at least to a first detector line of a first electrode and to a second detector line of a second detector electrode and is configured (Continued)

to apply a diagnose signal via the first and second detector lines and to detect a conductor break based on a response to the diagnose signal.

17 Claims, 2 Drawing Sheets

(56) References Cited

U.S. PATENT DOCUMENTS

| | | | |
|---|---|---|---|
| 2010/0123670 A1* | 5/2010 | Philipp | G06F 3/044 |
| | | | 345/173 |
| 2011/0050620 A1* | 3/2011 | Hristov | G06F 3/0418 |
| | | | 345/174 |
| 2014/0246415 A1* | 9/2014 | Wittkowski | D03D 1/0088 |
| | | | 219/201 |
| 2015/0048850 A1* | 2/2015 | Neel | G06F 3/044 |
| | | | 324/679 |
| 2015/0301658 A1 | 10/2015 | Saucedo et al. | |
| 2016/0075297 A1* | 3/2016 | Lamesch | H03K 17/955 |
| | | | 324/603 |
| 2016/0085338 A1* | 3/2016 | Yasue | G06F 3/0416 |
| | | | 345/174 |
| 2017/0044813 A1* | 2/2017 | Pribisic | G01V 3/08 |
| 2017/0184421 A1 | 6/2017 | Sattler et al. | |
| 2017/0199022 A1* | 7/2017 | Anderson | H03K 17/955 |
| 2018/0046296 A1* | 2/2018 | Katsuta | G02F 1/13338 |
| 2018/0080802 A1* | 3/2018 | Urig | G01D 18/00 |
| 2018/0093695 A1* | 4/2018 | Hattori | G01B 7/14 |
| 2019/0023310 A1* | 1/2019 | Odate | B62D 15/021 |
| 2019/0146627 A1* | 5/2019 | Schediwy | H03K 17/962 |
| | | | 345/174 |
| 2019/0389309 A1* | 12/2019 | Staude | G06F 3/044 |
| 2020/0041680 A1* | 2/2020 | Okazaki | G01V 3/08 |

FOREIGN PATENT DOCUMENTS

| | | |
|---|---|---|
| CN | 105051571 A | 11/2015 |
| CN | 105067022 A | 11/2015 |
| CN | 106066748 A | 11/2016 |
| CN | 107017871 A | 8/2017 |
| WO | WO2008009305 A1 | 1/2008 |

OTHER PUBLICATIONS

Written Opinion corresponding to International Application No. PCT/EP2018/077939, dated Jan. 7, 2019, 7 pages.

English translation of Chinese Examination Report corresponding to Chinese Application No. 201880068115.0, dated Aug. 5, 2020, 11 pages.

\* cited by examiner

CAPACITIVE SENSOR SYSTEM

TECHNICAL FIELD

The invention generally relates to a capacitive sensor system and to a method for conductor break detection in a capacitive sensor system.

BACKGROUND

Capacitive sensors today are used for a vast variety of applications, like input devices (e.g. touchpads, capacitive sliders, touch wheels, etc.), proximity sensors or occupant detection systems.

There are many different types of capacitive sensors known in the art, but most of them rely on the following principle. A sensing electrode is disposed so that an approaching object (person, hand, finger or the like) changes tSubhe capacitance of the sensing electrode with respect to ground. This changing capacitance is measured by a measurement circuit. For instance, the sensing electrode may be connected to an alternating voltage, e.g. a square wave voltage, and the current through the electrode, which depends on its capacitance, can be converted by the measurement circuit into a voltage. This voltage is indicative of the capacitance and thus may be used to determine whether an object is near the sensing electrode. In some applications, for each sensing electrode there is provided a guard electrode, which is kept at the same electrical potential as the corresponding electrode and serves to shape the effective detection space of the electrode.

Some sensor systems are implemented as foil or textile sensors, where the electric components are normally printed structures made of conducting ink disposed on a flexible foil or textile substrate. The sensors allow for adaptation to a wide variety of surface geometries.

In many applications, like for hand detection on a steering wheel, there is not one but a plurality of electrodes, e.g. 2, 5, 10 or even more. The individual electrodes may be disposed along a surface (e.g. of the steering wheel) in order to determine the specific location of an object like the hand of the user. It is understood that such detection systems, many of which are safety-relevant, can only work reliably if all electrical components are intact. This pertains in particular to the possibility of a conductor break.

Currently, there are several approaches to diagnose the integrity of the sensor system. For a guard/sense sensor, each electrode can be diagnosed individually with a DC current, requiring either a diode or resistor between sensing electrode and guard electrode, which is currently expensive and/or difficult to implement on a foil sensor because it takes space (using a discrete capacitor or resistance), or it requires a crossing of foil layers, which is currently not feasible for the required reliability and robustness. Alternatively, each electrode is diagnosed individually by measuring the sense/guard capacitance. This measurement, however, is not accurate enough to reliably detect all relevant breaks in the electrodes, which is due to the parasitic capacitances of the measurement circuit itself, the cabling, the tolerance of the sensor capacitance, and the measurement accuracy of the measurement circuit. For a sense/guard or sense only sensor, each sense or guard electrode may also be diagnosed individually by adding an additional wire to the opposite end of the sense electrode, requiring an additional wire per electrode, leading to additional costs. Also, the increased number of wires and connections makes integration into the steering wheel difficult or impossible due to restrained space conditions in the steering wheel.

SUMMARY

It is thus an object of the present invention to provide means for reliable break detection in a capacitive sensor system having multiple electrodes.

This problem may be solved by a capacitive sensor system and/or method for break detection in a capacitive sensor system according to the claims.

The invention provides, in one aspect, a capacitive sensor system. The sensor system comprises a sensor arrangement with a plurality of capacitive electrodes, each being connected to a corresponding detector line. The electrodes can be sensor electrodes and/or guard electrodes. "A plurality" here and in the following means "at least two". "Connected" here and in the following means "electrically connected" and normally "conductingly connected". However, this includes the possibility that the connection is via an intermediate element (e.g. a line). The term "line" here and in the following refers to any kind of conducting connection, e.g. a wire, a printed conductor path or the like. The term "sensor arrangement" is not to be construed in any limiting way and simply denotes the part of the sensor system that comprises the electrodes. Preferably though, the sensor arrangement is a single piece with all electrodes being disposed on a common (flexible or rigid) substrate. It is understood that each electrode has a capacitance with respect to ground and/or other electrodes. At least if the electrode is a sensing electrode, this capacitance depends on the presence of an object within a detection space, normally near the respective sensing electrode. An electrode normally has a flat, extensive shape, but in general can be any kind of conducting structure. Each of the electrodes is connected to a detector line, which means that there is one detector line for each electrode (and vice versa). By the detector lines, it is possible to individually apply a voltage to each electrode.

The sensor system further comprises a detector device connected to each detector line and configured to detect the capacitance of at least each sensor electrode by applying a detector signal. Normally, the detector device applies a voltage signal as the detector signal and detects the current flowing through the respective detector line into an/or out of the electrode. Thus, it is possible to determine the current capacitance of the electrode and e.g. by comparing this capacitance to a nominal capacitance, determine whether the object is present in the detection space or not. Of course, the detector device may at least partially be software-implemented.

The sensor arrangement comprises at least one electrode group comprising at least two electrodes, each electrode of an electrode group being connected to another electrode via a resistive element so that all electrodes of this electrode group are connected in series. In other words, among the electrodes of the sensor arrangement, at least two electrodes belong to one electrode group. In such an electrode group, every electrode is connected to another electrode via a resistive element. Thus, the resistive element is connected between two electrodes, normally by connection lines. All electrodes of the respective electrode group are connected in series with one resistive element connected between each pair of electrodes. Therefore, in one electrode group, each electrode is connected to the detector device via a detector line and to at least one other electrode via the resistive element (and connecting lines which connect the resistive element to the electrodes). The resistive element in general is any kind of element having a non-zero or non-negligible resistance. This includes the possibility that it also has a non-negligible reactance. Preferably, however, the resistive element comprises a resistor and normally is a resistor. It will be appreciated, that in order to reduce the influence of the resistive elements on the impedance measurement by the detector device, the resistive elements should be selected to be large enough so that the impedance measurement is not disturbed. On the other hand, if the impedance measurement only focusses on the capacitance, it is possible to operate the sensor device with a sinusoidal detector signal and base the measurement on the imaginary part of the measured current so that the resistive part is suppressed. In that case, the requirements regarding the value of the resistive elements are less strict.

A diagnose device is connected, for each electrode group, at least to a first detector line of a first electrode and to a second detector line of a second detector electrode and is configured to apply a diagnose signal via the first and second detector lines and to detect a conductor break based on a response to the diagnose signal. When considering the electrodes of one electrode group connected in series, the first and second electrodes may correspond to opposite ends, e.g. they may be the first electrode and the last electrode. The diagnose device applies a diagnose signal, e.g. by applying a voltage between the first detector line and the second detector line. The diagnose signal gives rise to a response, e.g. to a current flowing through the first and the second detector line. The diagnose device can detect a conductor break, i.e. a break in the first or second detector line or in any of the elements in between, based on the response. For example, if the diagnose device applies a certain voltage and the resulting current is below a predefined threshold, this can be interpreted as a conductor break. It should be noted that the diagnose device does not have to be physically separate from the detector device. Rather, both devices may at least partially be realised by one and the same circuitry.

The inventive sensor system allows for a simple and effective detection of a conductor break at least in the first and second detector line of each group and in the elements in between. It is highly advantageous that the diagnose device uses the already existing detector lines to perform a diagnosis. Apart from these detector lines, which are used for the operation of the detector device, the sensor system needs no or, depending on the embodiment, minimal additional connections between the diagnose device and the sensor arrangement. This considerably simplifies the construction and installation of the sensor system. It should be borne in mind that for some applications, the sensor arrangement is installed in one location where a space-saving design is needed, while the detector device and the diagnose device are installed in a separate location, wherefore the number of interconnecting lines is a decisive factor. Also, in such a design, the sensor arrangement may need a terminal for connecting each of the interconnecting lines e.g. by a plug-in connection. It is understood that the space needed for the sensor arrangement can be considerably reduced if the number of terminals is kept small. The only additional circuitry needed by the inventive sensor system are the resistive elements (together with the above-mentioned interconnection lines) connecting the electrodes. These, however can be implemented as part of the sensor arrangement in a space-saving and low-cost manner.

Preferably, the detector signal is an AC signal. In particular, the detector device may comprise a voltage source and the detector signal can be an AC voltage signal. This may e.g. be a rectangular or sinusoidal signal. The frequency can be chosen according to the respective application and the object to be detected. Optionally, the detector signal may comprise a DC component, which, however, normally does not enhance the capacitance detection performed by the detector device.

On the other hand, the diagnose signal preferably is a DC signal. The diagnose device may comprise a voltage source and the diagnose signal can be a DC voltage signal. The diagnose signal may comprise an AC component. However, the resistance increase caused by a conductor break can most easily be distinguished by its effect on a DC signal.

In general, the sensor arrangement and its components can be realized in different ways. E.g., the sensor arrangement could comprise a printed circuit board with the electrodes and the resistive elements disposed on the surface of the board. According to a preferred embodiment, the sensor arrangement is a printed foil sensor. In such a case, the sensor arrangement comprises a (normally isolating) foil substrate, e.g. made from polyimide, PEEK, polyester or the like. Conducting lines may be printed conductor paths made of silver ink or other conducting material. The same material may be used for the electrodes. Resistive elements may be printed carbon structures. It is understood that a printed foil sensor has a certain degree of flexibility that allows for adaptation to different surface shapes. The foil sensor may have a multi-layer structure.

The inventive capacitive sensor system is useful for different kinds of applications. In particular, it can be adapted for hand detection on a steering wheel. The sensor arrangement with its plurality of electrodes can be disposed along the surface of the steering wheel, thus allowing not only to detect the presence of a hand on the steering wheel but also to distinguish the location of the touch and/or the number of hands on the steering wheel. In this context it may be referred to as a capacitive sensor system for hand detection on the steering wheel.

According to one embodiment, the sensor arrangement comprises a plurality of electrode groups, each comprising exactly two electrodes. In other words, the electrodes of the sensor arrangement are interconnected pairwise. The advantage of this embodiment is that only a minimal number of resistive elements is needed, namely the total number of electrodes divided by 2.

According to a different embodiment, at least one electrode group comprises at least one intermediate electrode connected in series between the first and second electrode and connected to an intermediate detector line. This embodiment has the advantage that by applying the diagnose signal only to the first and second detector lines, a conductor break of any intermediate electrode or the elements connecting it to other electrodes can be detected at the same time. Therefore, e.g. in a case where there is no need to locate the conductor break in a more precise way, this embodiment greatly simplifies that the diagnose process.

In yet another embodiment which enables to detect a break in the intermediate detector lines, a DC current can be injected onto the intermediate detector lines, and by measuring the voltage on the intermediate detector lines, a break in the intermediate detector lines can be detected.

In particular, the sensor arrangement may comprise a single electrode group. In other words, all electrodes of the sensor arrangement are connected in series. This makes it possible to detect a conductor break regarding any of the electrodes with a single detector signal.

According to one embodiment, the diagnose device is connected only to the first detector line and the second detector line. As mentioned above, if there is no need to locate the conductor break but simply to detect any conductor break as such, this is a simple and effective approach.

If, however, the location of the conductor break needs to be detected, this can also be achieved even if one or several intermediate electrodes are present. According to one such embodiment, the diagnose device is connected to at least one intermediate detector line. For example, if the electrode group comprises three electrodes, a conductor break at the third electrode would not affect any current flowing from the first detector line to the second detector line. However, current from the first or second detector line to the third detector line would be greatly reduced. Thus, the additional connection to the intermediate detector line allows to discriminate between different locations.

If the diagnose device is connected to at least three different detector lines as described above, there are different possibilities how to apply diagnose signals to these detector lines. For example, it would be conceivable to simultaneously apply different voltages to all detector lines and to deduce the individual resistance from the individual currents. This would, in general, correspond to analyzing a superposition of currents, which is feasible, though complex. According to a different, preferred embodiment, the diagnose device is configured to sequentially apply a diagnose signal via each of a plurality of pairs of detector lines. This means that one after another, the diagnose device selects different pairs of detector lines and first applies a diagnose signal to the first pair, then to the second pair and so on. In order to locate a conductor break, it is normally not necessary to try out all possible combinations of pairs, but e.g. N−1 pairs if N is the total number of detector lines. It will however be noted that the detection of individual electrode breaks does not need to be done sequentially. Another option is to measure all the resistances in parallel in one step, for example by applying a DC voltage between the first and last electrodes, and measuring the intermediate voltages, and optionally the current applied by the DC source.

As mentioned above, electrodes are normally not directly connected to the resistive elements, but via connection lines. If the intermediate detector lines are directly connected to the electrodes in a manner that bypasses the connection lines, measurements by the diagnose device can become ambiguous. For example, if a diagnose signal is applied to the detector lines of two neighboring electrodes and a conductor break is detected, this could be due to a break at either of the electrodes. This ambiguity can be resolved by a preferred embodiment where least one intermediate detector line is connected to a connection line between an electrode and a resistive element. One might also say that the intermediate detector line is connected to the electrode indirectly via a portion of the connection line. On the other hand, one might also say that the connection line is connected to the electrode by a portion of the intermediate detector line. If the described connection is used for neighboring detector lines, there is only a single electrode connected between them, so that a conductor break, if detected, can be attributed to this electrode.

The above-mentioned disambiguation is possible for every intermediate detector line. However, in order to unambiguously attribute a conductor break to every electrode, at least one additional connection between the diagnose device and the sensor arrangement is necessary. According to a preferred embodiment, the sensor system comprises at least one diagnose line connected to the diagnose device and to a connection line between an electrode and a resistive element. This diagnose line is an additional line distinct from the detector lines and is not connected to the detector device (if this is physically distinct from the diagnose device). It should be noted that the described embodiment can also be employed if there are no intermediate detector lines, i.e. the electrode group comprises only two electrodes.

In such an embodiment, the diagnose device can be configured to apply a diagnose signal via the diagnose line and at least one detector line and to detect a conductor break based on a response to the diagnose signal. It is understood that this can be combined with applying diagnose signals to different pairs of detector lines.

The invention also provides a method for operating a capacitive sensor system. The sensor system comprises a sensor arrangement comprising a plurality of capacitive electrodes, each being connected to a corresponding detector line and a detector device connected to each detector line and configured to detect the capacitance of each electrode by applying a detector signal. The sensor arrangement comprises at least one electrode group comprising at least two electrodes, each electrode of an electrode group being connected to another electrode via a resistive element so that all electrodes of this electrode group are connected in series. The method comprises, for each electrode group, applying a diagnose signal via a first detector line of a first electrode and a second detector line of a second detector electrode and detecting a conductor break based on a response to the diagnose signal. It is understood that the method can be performed by a diagnose device connected to the first detector line and the second detector line as described above. All these terms have been described above with respect to the inventive sensor system and therefore will not be explained again.

Preferred embodiments of the inventive method correspond to those of the inventive system.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
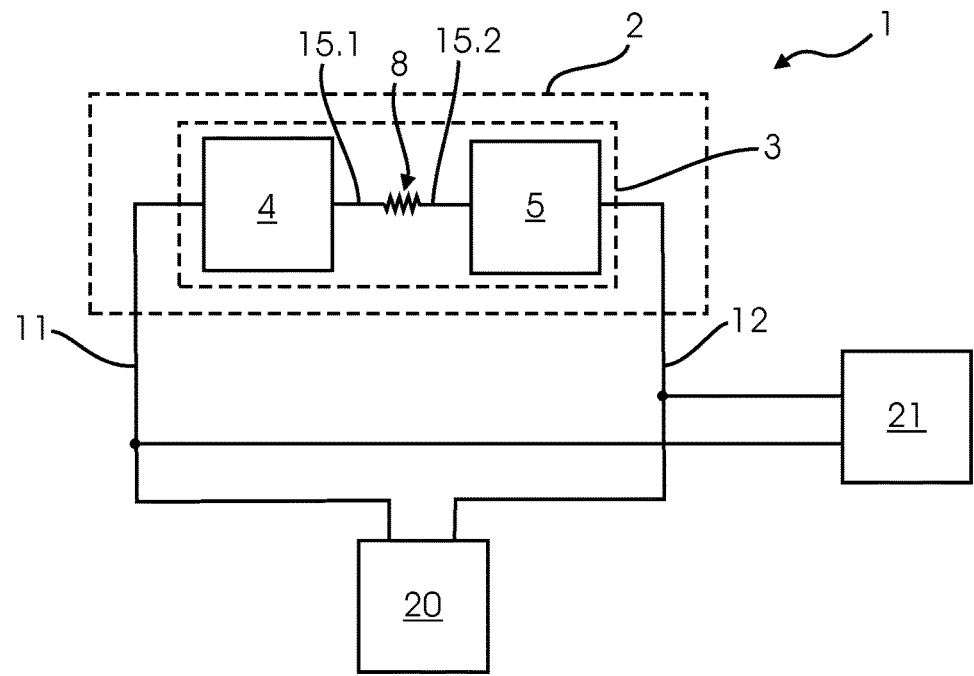
FIG. 1 is a schematic view of a first embodiment of an inventive sensor system.

FIGS. 1 to 4 show four different embodiments of inventive sensor systems 1, which e.g. could be used for hand detection on a steering wheel. With reference to the first embodiment shown in FIG. 1, the sensor system 1 comprises a sensor arrangement 2, which could be a printed foil sensor that is disposed along the surface of the steering wheel. Any lines and electrodes on the flexible substrate of the foil sensor can be printed. The sensor arrangement 2 comprises two electrodes 4, 5, which are connected to a detector device 20 via detector lines 11, 12. In this example, the electrodes 4, 5 are sensing electrodes, but each of them could also be a guard electrode. During normal operation of the device 1, the detector device 20 applies (different or identical) detector signals to the detector lines 11, 12. Normally, the detector signals are AC voltage signals, which may be e.g. rectangular or sinusoidal. The detector device 20 measures a current flowing through the respective detector line 11, 12, which is then representative of the capacitance (or, more generally, the impedance) of the respective electrode 4, 5. The capacitance, in turn, depends on the presence of an object within a detection space of the respective electrode 4, 5. When considering a hand detection on a steering wheel, the detection space is normally located over a portion of the surface of the steering wheel.

The reliability of the sensor system 1 depends on the integrity of the electrodes 4, 5 and their connection to the detector lines 11, 12. Therefore, the sensor system 1 provides means to verify this integrity. Both electrodes 4, 5 are connected in series by two connection lines 15.1, 15.2 and a resistor 8, thereby forming an electrode group 3. It should be noted that the resistor 8 can also be a printed structure e.g. consisting of carbon. Further, a diagnose device 21 is connected to each of the detector lines 11, 12 by auxiliary lines 22, 23. In order to perform a diagnosis of the sensor arrangement 2, the diagnose device 21 applies a diagnose signal via the auxiliary lines 22, 23 and the detector lines 11, 12. For example, the diagnose signal can be a DC voltage signal. It may be applied in a diagnose mode for which the detector device 20 is temporarily deactivated. If the entire circuitry is intact, the current flowing through the auxiliary lines 22, 23 largely depends on the resistance of the resistor 8 and, to a smaller extent, by the resistance of the lines 11, 12, 15.1, 15.2, 22, 23 and electrodes 4, 5. The diagnose device 21 measures the current and compares it to a stored reference value which corresponds to an intact circuitry. If the current differs too much from the reference value, this is interpreted as a conductor break in any of the above-mentioned elements 4, 5, 11, 12, 15.1, 15.2, 22, 23. In particular, a conductor break regarding any of the electrodes 4, 5 can be safely detected. If a conductor break is detected, the diagnose device 21 may output a corresponding signal e.g. to an on-board computer of a vehicle.

Figure 2:
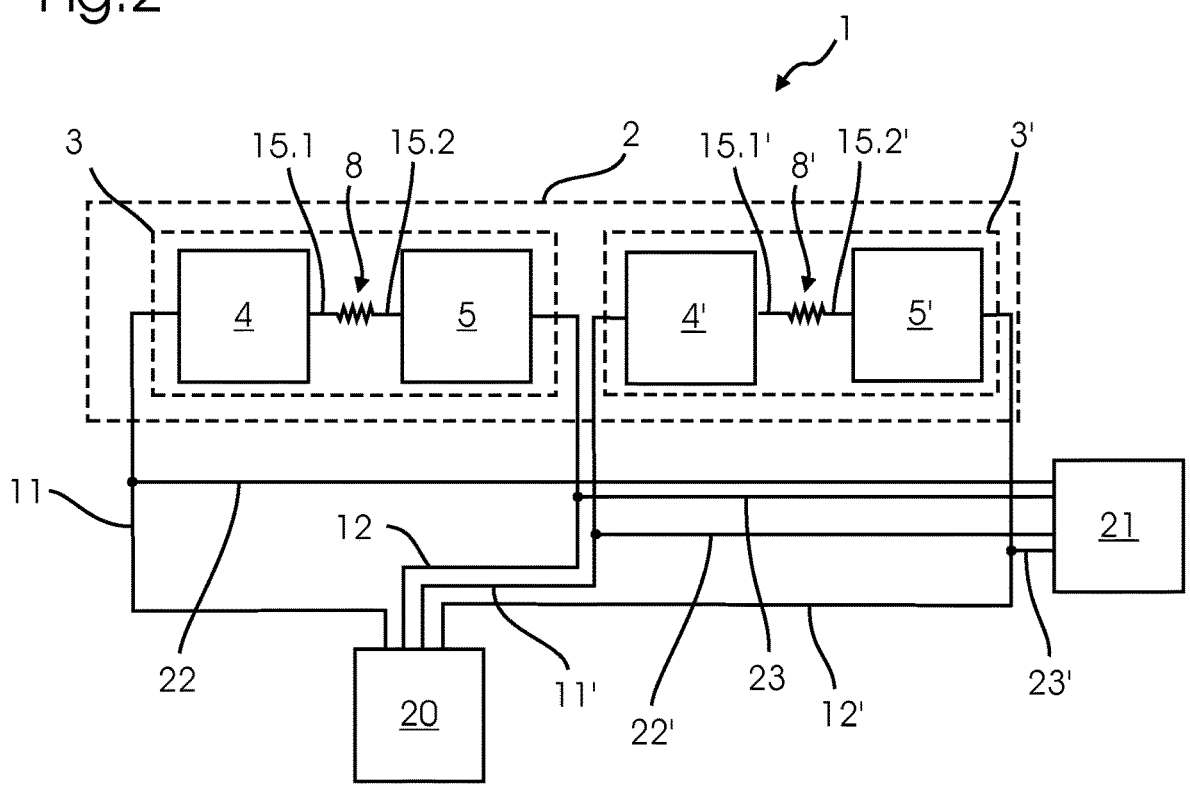
FIG. 2 is a schematic view of a second embodiment of an inventive sensor system.

While the embodiment in FIG. 1 shows a single electrode group 3 consisting of two electrodes 4, 5, this concept can be generalized as shown in FIG. 2. In this second embodiment, the sensor arrangement 2 comprises four electrodes 4, 4', 5, 5', which are individually connected to the detector device 20 via detector lines 11, 11', 12, 12'. Two electrodes 4, 5 are connected via a resistor 8, thus forming a first electrode group 3, while the other two electrodes 4', 5' are connected by a resistor 8' to form a second electrode group 3'. The detector lines 11', 12' of the second electrode group 3' are connected to the diagnose device 21 via auxiliary lines 22', 23'. In the diagnose mode, the diagnose device 21 may sequentially or simultaneously apply diagnose signals via the detector lines 11, 12 of the first electrode group 3 and via the detector lines 11', 12' of the second electrode group 3', respectively. It is understood that the concept shown in FIG. 2 can be generalized to greater numbers of electrodes, requiring one resistor 8, 8' for each pair of electrodes 4, 4', 5, 5'.

Figure 3:
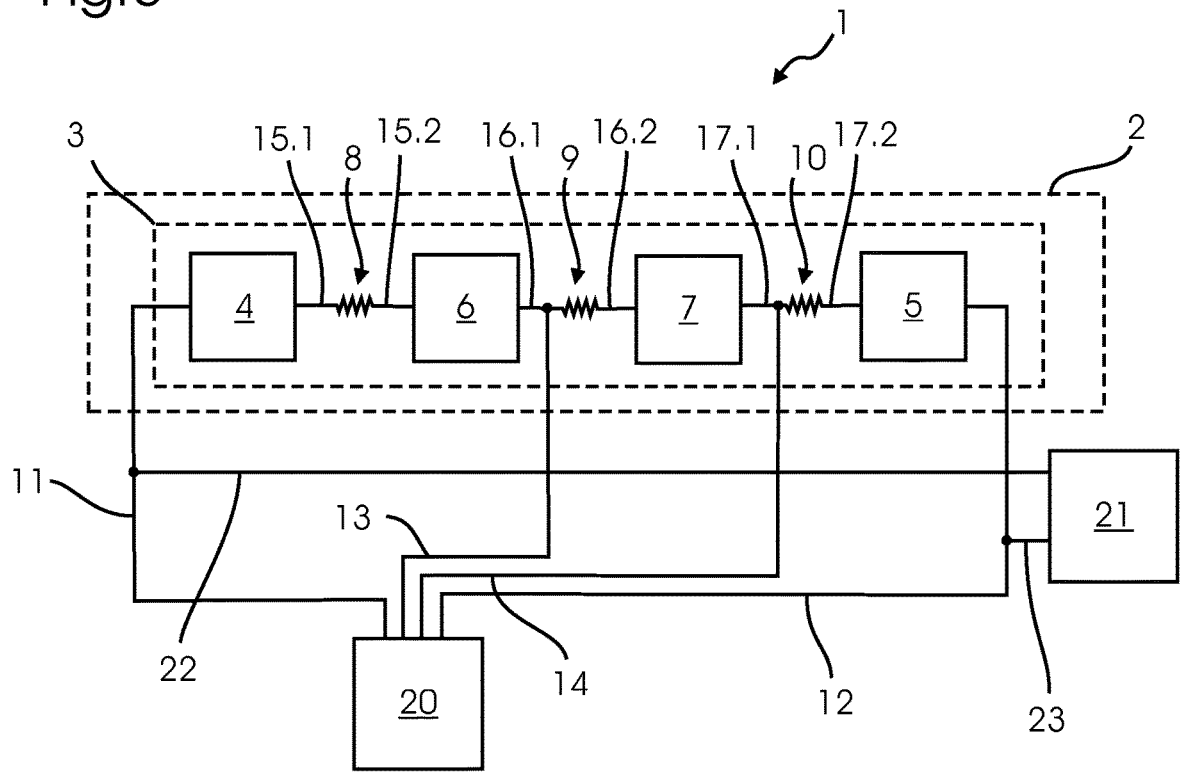
FIG. 3 is a schematic view of a third embodiment of an inventive sensor system.
Figure 4:
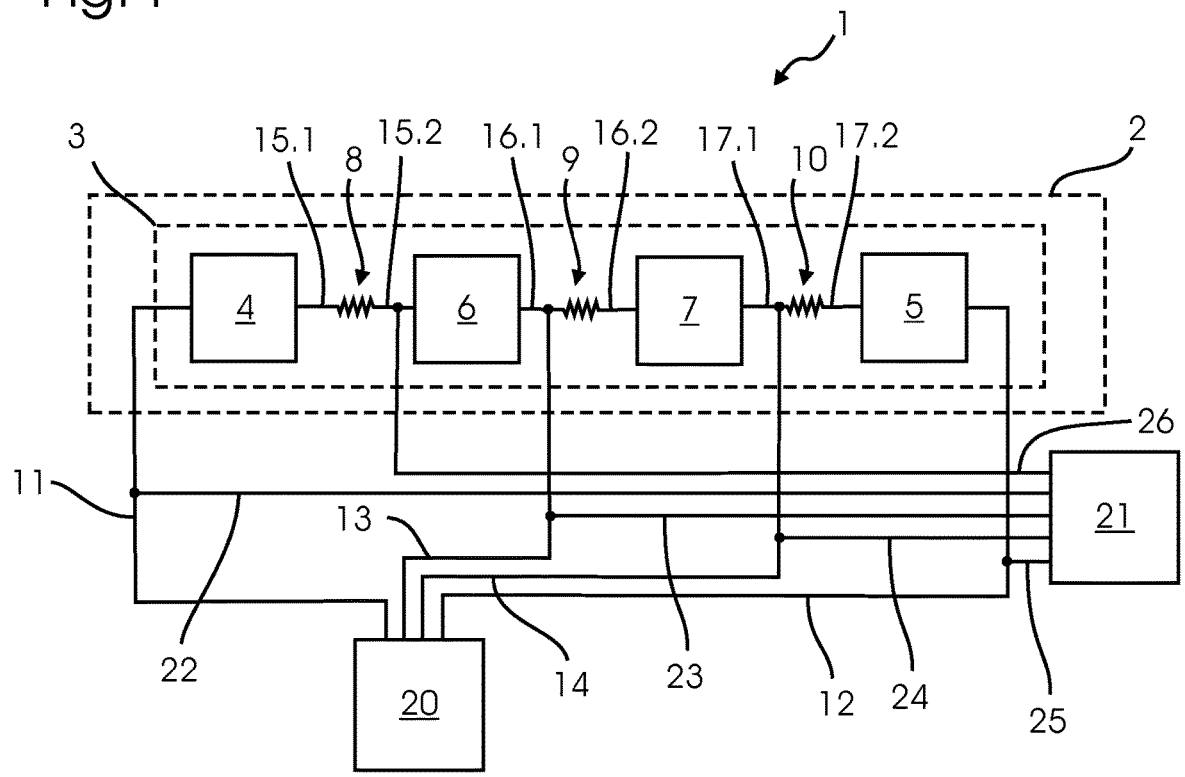
FIG. 4 is a schematic view of a fourth embodiment of an inventive sensor system.

If the number of electrodes in the sensor system 1 increases, it may be more efficient to employ other diagnose concepts, such as the one shown in FIG. 3. In this embodiment, the sensor arrangement 3 comprises four electrodes 4-7, which are connected to the detector device 20 via detector lines 11-14. In this case, all electrodes 4-7 are connected in series by resistors 8-10 and connection lines 15.1, 15.2, 16.1, 16.2, 17.1, 17.2. Thus, the electrodes 4-7 form a single electrode group 3. A first detector line 11 of a first electrode 4 and a second detector line 12 of a second electrode 5 are connected to the diagnose device 21 via auxiliary lines 22, 23. The first and second electrodes 4, 5 are disposed on opposite ends of the series connection. In between are two intermediate electrodes 6, 7, which are connected to the detector device 20 via intermediate detector lines 13, 14. These intermediate detector lines 13, 14 are not connected to the diagnose device 21. When the diagnose device 21 applies a diagnose signal via the first detector line 11 and the second detector line 12, the resistance of the electrode group 3 increases significantly if there is a conductor break at any of the electrodes 4-7. Otherwise, the resistance is largely determined by the three resistors 8, 9, 10. It is understood that the concept shown in FIG. 3 can be generalized to larger electrode groups, e.g. comprising tens or even hundreds of electrodes.

While the concept shown in FIG. 3 provides a simple and efficient way to detect if there is any conductor break at all, it does not allow for any localization of the conductor break. Such a localization is possible with the embodiment shown in FIG. 4, which is largely identical to the embodiment of FIG. 3. However, the diagnose device 21 is connected to the intermediate detector lines 13, 14 by additional auxiliary lines 24, 25. Furthermore, the diagnose device 21 is connected by a diagnose line 26 to the second auxiliary line 15.2 which connects a first resistor 8 to a first intermediate electrode 6. It should be noted that the first intermediate detector line 13 and the second intermediate detector line 14 are not directly connected to the first intermediate electrode 6 and the second intermediate electrode 7, respectively. Rather, they are connected to a third connection line 16.1 connecting the first intermediate electrode 6 to a second resistor 9 and to a fifth connection line 17.1 connecting the second intermediate electrode 7 to a third resistor 10.

In the diagnose mode, the diagnose device 21 applies diagnose signals sequentially to different pairs of lines selected from the detector lines 11-14 and the diagnose line 26. For example, if a diagnose signal is applied to the first detector line 11 and the diagnose line 26, integrity of the first electrode 4 can be checked individually. In order to perform a diagnosis of the second intermediate electrode 7, a diagnose signal can be applied to the first intermediate detector line 13 and the second intermediate detector line 14. Applying a voltage between the diagnose line 26 and the first intermediate detector line 13 could lead to potential problems because the resistance of the first intermediate electrode 6 is rather low. This problem could be solved by either adding another resistor in either of the second connection line 15.2 and the third connection line 16.1 or by performing a two-step diagnosis. In a first step, a diagnose signal is applied via the first detector line 11 and the diagnose line 26, while in a second step, a diagnose signal is applied via the first detector line 11 and the first intermediate detector line 13. By comparing the responses it is possible to determine whether any conductor break pertains to the first electrode 4 or the first intermediate electrode 6. It should be noted that there are a variety of possibilities how the detector lines 11, 12, 13, 14 and the diagnose line 26 can be combined pairwise in order to locate determine the location of a conductor break. Apart from allowing for a localization of the conductor break with respect to the electrodes 4-7, the embodiment of FIG. 4 also allows for a detection of a conductor break in any of the intermediate detector lines 13, 14, which is not possible with the embodiment of FIG. 3.

All embodiments shown in FIGS. 1-4 provide a simple and efficient way to diagnose the integrity of the sensor arrangement 2. Apart from the detector lines 11-14, which are needed for the operation of the sensor arrangement 2, the embodiments of FIGS. 1 to 3 require no additional connections to the sensor arrangement 2, while the embodiment of FIG. 4 only requires a single diagnose line 26. The diagnose device 21 utilizes largely or completely the detector lines 11-14 used by the detector device 20. This is highly advantageous in a situation where the detector device 20 and the diagnose device 21 are spaced apart from the sensor arrangement 20 and connected by a cable.

The invention claimed is:

1. A capacitive sensor system, comprising:
a sensor arrangement with a plurality of capacitive electrodes, each being connected to a corresponding detector line; and
a detector device connected to each detector line and configured to detect the capacitance of each electrode by applying a detector signal;
wherein
the sensor arrangement comprises at least one electrode group comprising at least two electrodes, each electrode of an electrode group being connected to another electrode via a resistive element so that all electrodes of this electrode group are connected in series; and
a diagnose device is connected, for each electrode group, at least to a first detector line of a first electrode and to a second detector line of a second electrode and is configured to apply a diagnose signal via the first and second detector lines and to detect a conductor break based on a response to the diagnose signal.

2. A capacitive sensor system according to claim 1, wherein the detector signal is an AC signal.

3. A capacitive sensor system according to claim 1, wherein the diagnose signal is a DC signal.

4. A capacitive sensor system according to claim 1, wherein the sensor arrangement is a printed foil sensor or a printed textile sensor.

5. A capacitive sensor system according to claim 1, wherein the capacitive sensor system is adapted for hand detection on a steering wheel.

6. A capacitive sensor system according to claim 1, wherein the sensor arrangement comprises a plurality of electrode groups, each comprising exactly two electrodes.

7. A capacitive sensor system according to claim 1, wherein at least one electrode group comprises at least one intermediate electrode connected in series between the first and second electrode and connected to an intermediate detector line.

8. A capacitive sensor system according to claim 7, wherein the sensor arrangement comprises a single electrode group.

9. A capacitive sensor system according to claim 7, wherein the diagnose device is connected only to the first detector line and the second detector line.

10. A capacitive sensor system according to claim 7, wherein the diagnose device is connected to at least one intermediate detector line.

11. A capacitive sensor system according to claim 10, wherein the diagnose device is configured to sequentially apply a diagnose signal via each of a plurality of pairs of detector lines.

12. A capacitive sensor system according to claim 10, wherein the diagnose device is configured to apply a diagnose current into said at least one detector line and to detect a voltage signal on said at least one detector line.

13. A capacitive sensor system according to claim 7, wherein at least one intermediate detector line is connected to a connection line between an electrode and a resistive element.

14. A capacitive sensor system according to claim 1, wherein the capacitive sensor system comprises at least one diagnose line connected to the diagnose device and to a connection line between an electrode and a resistive element.

15. A capacitive sensor system according to claim 14, wherein the diagnose device is configured to apply a diagnose signal via the diagnose line and at least one detector line and to detect a conductor break based on a response to the diagnose signal.

16. A method for operating a capacitive sensor system which comprises:
a sensor arrangement with a plurality of capacitive electrodes, each being connected to a corresponding detector line; and
a detector device connected to each detector line and configured to detect the capacitance of each electrode by applying a detector signal;
wherein
the sensor arrangement comprises at least one electrode group comprising at least two electrodes, each electrode of an electrode group being connected to another electrode via a resistive element so that all electrodes of this electrode group are connected in series;
the method comprising, for each electrode group, applying a diagnose signal via a first detector line of a first electrode and a second detector line of a second electrode and detecting a conductor break based on a response to the diagnose signal.

17. A method for operating a capacitive sensor system according to claim 16, wherein said capacitive sensor system further comprises at least one diagnose line connected to the diagnose device and to a connection line between an electrode and a resistive element, and wherein said method comprises the steps of applying a diagnose signal via the diagnose line and at least one detector line and detecting a conductor break based on a response to the diagnose signal.

* * * * *